United States Patent [19]

Pecukonis

[11] Patent Number: 4,491,785
[45] Date of Patent: Jan. 1, 1985

[54] TRACING ELECTRICAL CONDUCTORS BY HIGH-FREQUENCY LOADING AND IMPROVED SIGNAL DETECTION

[75] Inventor: Joseph P. Pecukonis, Denver, Colo.

[73] Assignee: Pasar, Inc., Denver, Colo.

[21] Appl. No.: 236,050

[22] Filed: Feb. 19, 1981

[51] Int. Cl.³ .................... G01R 31/02; G01R 19/145
[52] U.S. Cl. .................................................. 324/67
[58] Field of Search ............ 324/51, 52, 66, 67, 324/73 PC

[56] References Cited

U.S. PATENT DOCUMENTS

| | | | |
|---|---|---|---|
| 3,597,680 | 8/1971 | Haddon | 324/67 |
| 3,641,536 | 2/1972 | Prosprich | 340/203 |
| 3,810,003 | 5/1974 | Portoulas | 324/51 |
| 3,826,977 | 7/1974 | Woodworth | 324/51 |
| 3,829,765 | 8/1974 | Siler | 324/67 |
| 3,914,561 | 10/1975 | Schardt et al. | 324/66 X |
| 3,982,181 | 9/1976 | Ferony et al. | 324/66 |
| 3,991,363 | 11/1976 | Lathrop | 324/67 X |
| 4,074,188 | 2/1978 | Boatman et al. | 324/73 PC |
| 4,114,092 | 9/1978 | Fry | 324/66 |
| 4,121,152 | 10/1978 | Hale et al. | 324/66 |
| 4,129,825 | 12/1978 | Brinegar | 324/52 |
| 4,227,145 | 10/1980 | Bonikowski et al. | 324/51 |
| 4,370,610 | 1/1983 | Allen et al. | 324/52 |
| 4,377,782 | 3/1983 | Metcalf et al. | 324/73 PC |

Primary Examiner—Gerard R. Strecker
Attorney, Agent, or Firm—John R. Ley

[57] ABSTRACT

Tracing and identifying electrical conductors in a power distribution network is achieved by use of a transmitter operating on a duty cycle of delivering or absorbing current pulses at a predetermined frequency from the power distribution network, and by use of a remotely located receiver which detects the electromagnetic field signals resulting from the current pulses in a predetermined cyclic manner of operation defined by a sample period and a reset period. During the sample period the receiver supplies an indication of the maximum received strength of the transmitter signal. The relationship of the duty cycle of the transmitter and the sampling and reset periods of the receiver reduce the potentially adverse influences of spurious signals on the receiver. The transmitter may include means for delivering constant energy content pulses to the power distribution network, thereby rendering the signals detected by the receiver insensitive to variations in voltage on the power distribution network. Improved signal filtering is achieved in the receiver by connecting a plurality of relatively low Q filters in series to reduce the effects of ringing and increase the damping factor, or by employing a digital capacitive filter switching technique for precise filtering by phase discrimination.

16 Claims, 29 Drawing Figures

Fig. 8F
MAX TIME ON | OFF

Fig. 8J
ON — OFF
91   89

Fig. 8K

Fig. 8K'
NETWORK VOLTAGE

Fig. 8L
PULSE MAGNITUDE
PULSE DURATION

TRACING ELECTRICAL CONDUCTORS BY HIGH-FREQUENCY LOADING AND IMPROVED SIGNAL DETECTION

BACKGROUND

This invention relates to new and improved apparatus and methods for tracing electrical conductors of both alternating and direct current electrical power, and more specifically it pertains to identifying circuit breakers, fuses, switches and other current conducting or handling devices connected to a source of electrical power.

It is oftentimes necessary to trace and identify particular circuits and electrical devices in a power distribution network, such as circuit breakers or fuses. Identification has typically been accomplished by practicing one or two manual techniques. One technique is to selectively disrupt power by opening the circuit breakers one at a time. When power is no longer present at the circuit, electrical device or feeder conductor in question, the opened circuit breaker identifies the item in question. The disadvantage to this technique is that electrical power is temporarily disconnected from each of the circuits and branch conductors in the course of the search, and it may be critical to maintain power to some of these circuits and branch conductors. Critical circuits include those which supply power to hospital equipment, computers, and many other types of sensitive electronic equipment. Another disadvantage is that a considerable amount of time is consumed in selectively and individually opening each of the circuit breakers. The second manual technique of identifying a circuit breaker is to introduce a sufficiently high electrical current load on the particular branch conductor to trip the circuit breaker or open the fuse. This technique is typically achieved by introducing an intentional short circuit to the branch conductor. The disadvantage of this technique is that the power will then be totally disrupted, creating the detrimental consequences previously mentioned. The increased current drawn by the short circuit can create dangerous momentary overheating or fire conditions or can cause larger trunk or distribution breakers to trip open at the same time the branch circuit breaker is tripped open. Of course, once a distribution breaker trips open, a large number of branch and distribution conductors will be disconnected from the source of electrical power.

A variety of test instruments are also available for testing and determining a variety of different electrical conditions including tracing and identifying feeder conductors, circuit breakers and other current conducting devices as well as tracing and identifying short circuited conductors. Certain of these prior art devices require interruption of power to the conductors in order to accomplish the tracing and identification. Other types of prior art devices employ means which cyclically create a current load on a particular conductor of sufficient magnitude to allow the increased current load, and hence the electrical device, to be identified with a conventional ammeter or impedance measuring device. Still other types of prior art devices introduce a relatively high-frequency signal on the conductor while conventional power is maintained and high-frequency signal is inductively detected. The high-frequency signal detection apparatus offers the best potential for reliable and simple circuit identification and detection, but such prior art devices are typically subject to adverse and detrimental influences, such as false signals resulting from spurious signals from transients and switching currents, reduced sensitivity for detecting and identifying the desired feeder conductors through panel enclosures and tubular conduits, and a somewhat limited specificity in isolating one particular conductor from a number of other conductors located in close proximity. Other disadvantages of such prior art systems and methods are known to those appreciating this particular field and its problems, and will be made more particularly apparent with comprehension of the desirable features of the present invention.

SUMMARY

It is the general objective of this invention to provide a new and improved apparatus and method for tracing and identifying electrical conductors which exhibits a relatively high immunity to adverse influences from spurious signals such as transients and switching currents, which does not require the interruption of applied power during the testing and tracing procedures, which exhibits a relatively high sensitivy and selectivity for more precisely identifying the particular electrical circuit conductor out of a closely assembled group without disassembly of various housings and enclosures containing the feeder conductor, and which is rendered substantially insensitive to different magnitudes of voltage applied over the power distribution network.

In accordance with certain summary aspects, the present invention comprises a transmitter means and a receiver means. The transmitter means operatively conducts a predetermined waveform of electrical current through the conductors and electrical devices of the electrical power distribution network. The predetermined current waveform is defined by a duty cycle having a first predetermined on-time period during which a plurality of pulses of current are conducted at a predetermined frequency, and a second predetermined off-time period during which no current is conducted. The on-time period is considerably less in duration than the off-time period. The receiver means operatively detects the predetermined frequency characteristic of the electromagnetic field signal induced in the conductors of the power distribution network by the predetermined waveform from the transmitter means. The receiver means includes a frequency filter for passing the inductively received signals of frequencies related to or the same as the predetermined frequency of the transmitter pulses. The receiver also includes means for periodically determining the magnitude of the detected signals on a cyclic basis and for indicating the relative magnitude of the detected signals. Each cycle of operation of the receiver includes a predetermined sampling time period and a predetermined reset time period. Each period of the cyclic operation of the receiver is less than each period of the duty cycle of the transmitter. By delivering the pulses from the transmitter over a limited time period of the duty cycle, the circuit elements of the transmitter are operated over a limited time and do not experience adverse heating. As a result, a very strong signal of low time duration is available. By operating the receiver on a cyclic basis by first sampling and then resetting, the adverse influences from spurious signals are minimized because such signals would have no effect on the transmitter if they occur during the reset time period. The relationship of the on and off periods of the transmitter duty cycle and the sample and reset periods of the cyclic operation of the receiver is such that a transmitter signal will be reliably detected on a sufficiently consistent basis to provide a reliable indication to the user, while the effects of spurious signals and other signals causing inaccuracies in detection are minimized or reduced as a result of the lack of signals during the off time period of the transmitter and the reset time period of the receiver.

In accordance with another significant summary aspect of the present invention, the transmitter includes means for delivering constant energy content pulses. When utilizing the transmitter and receiver in an alternating current power distribution network, it is appreciated that the voltage over the power network is constantly changing. Adjusting the time duration of the pulses in accordance with a hyperbolic relationship to the voltage magnitude obtains constant energy content pulses. A resonant circuit of a transducer of the receiver is influenced by the constant energy pulses to supply an approximately constant output signal. As a result, the instantaneous voltage magnitude over the power distribution network at the point in time when each transmitter pulse is delivered will have no effect on varying the relative indication signals obtained by the receiver, since the receiver will obtain a relatively constant output signal by detecting the constant energy content pulses.

The invention itself is more precisely defined by the appended claims. The improvements and concepts from the present invention are more specifically described in the accompanying description of the preferred embodiments taken in conjunction with the drawings.

DRAWINGS

FIGS. 3A, 3B, 3C, 3D, 3E, 3F, 3G, 3H and 3I are waveform diagrams illustrating the operation of the transmitter shown in FIG. 2.

Figure 7:
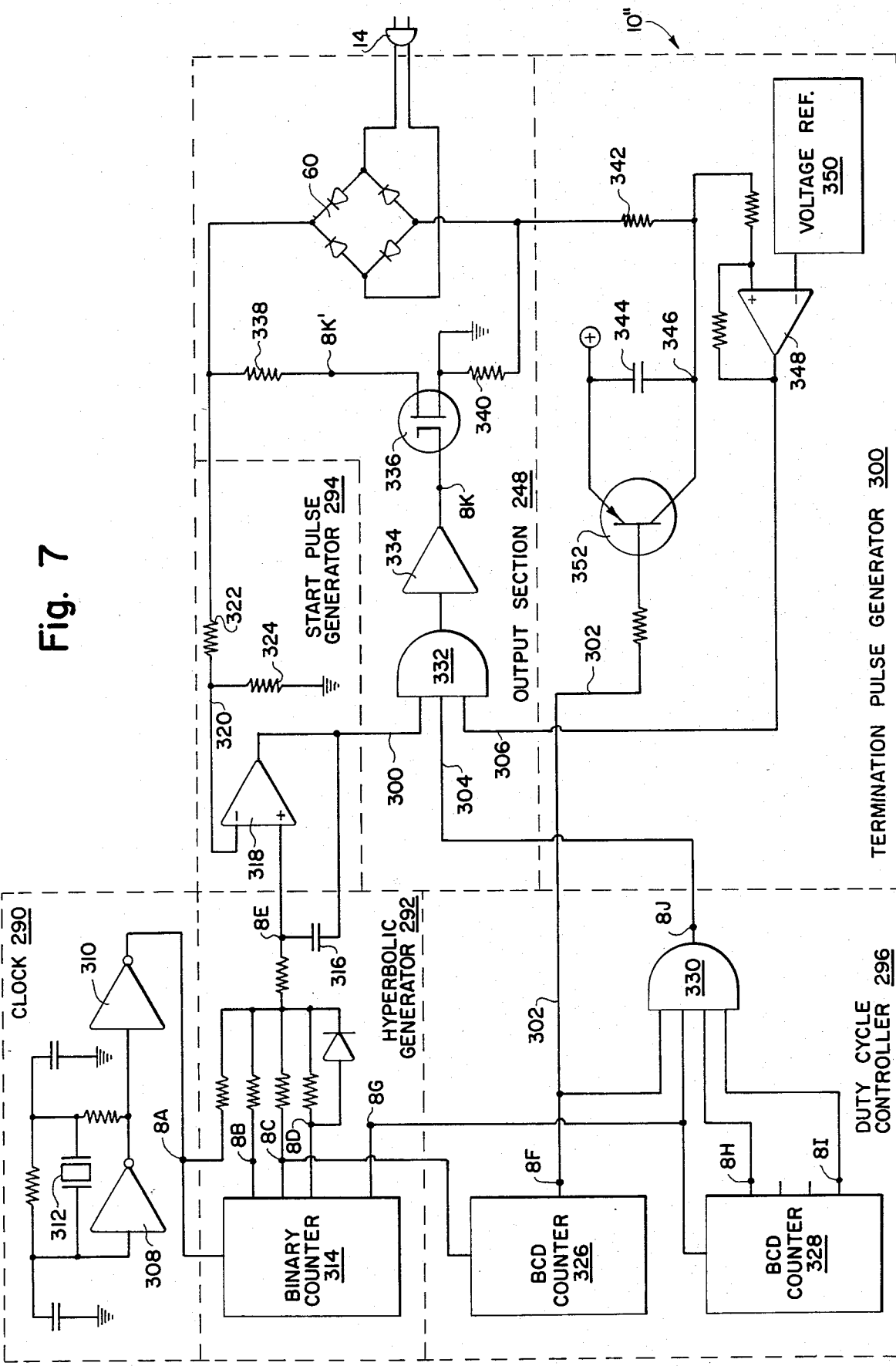
FIG. 7 is a schematic diagram of another embodiment of the transmitter shown in FIG. 1.

FIGS. 8A, 8B, 8C, 8D, 8E, 8F, 8G, 8H, 8I, 8J, 8K and 8K' are waveform diagrams illustrating the operation of the transmitter shown in FIG. 7, and FIG. 8L is a graph of a hyperbolic relationship of voltage magnitude and pulse width duration, which illustrates an operating principle of the transmitter shown in FIG. 7.

PREFERRED EMBODIMENTS

Figures 1, 2:
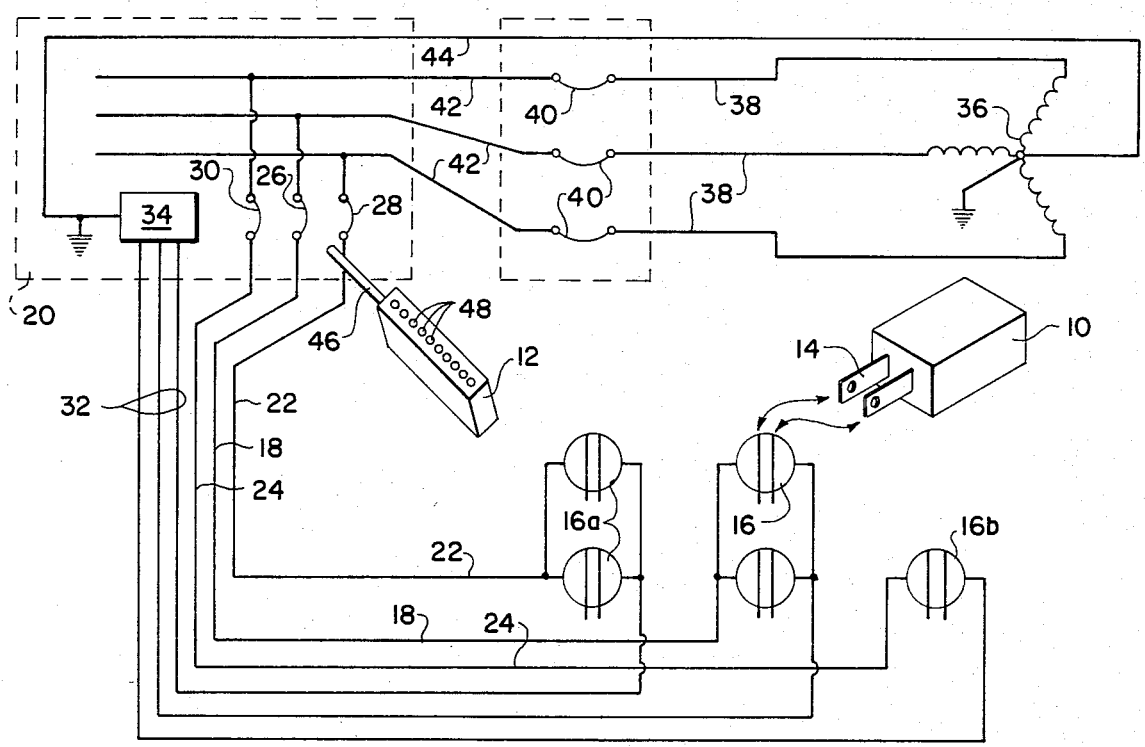
FIG. 1 is a generalized and schematic view of a transmitter and a receiver of the present invention illustrated in conjunction with a schematic electrical power distribution network.
FIG. 2 is a schematic diagram of one embodiment of the transmitter shown in FIG. 1.

The two basic components of the present invention are a transmitter 10 and a receiver 12 shown in FIG. 1. The transmitter 10 is electrically connected into a power distribution network through which electrical power is supplied, as by connecting a plug prong 14 of the transmitter 10 into a convenience outlet 16, for example. The convenience outlet 16 is electrically connected to a branch line or conductor 18 extending from a load center 20. Other branch lines, e.g. 22 and 24, also extend from the load center 20 and are connected with other elements such as additional convenience outlets 16a and 16b. Electrical power is supplied to the branch conductors 18, 22 and 24 through branch circuit breakers 26, 28 and 30, respectively, which are located within the load center 20. Neutral conductors 32 return current flow from the branch conductors 18, 22 and 24 to the load center at a neutral bus 34. Electrical power is supplied to the load center 20 from a secondary line transformer 36, a plurality of feeder conductors 38, a plurality of main distribution breakers 40 and a plurality of distribution conductors 42 of the power distribution network, as is typical. A ground conductor 44 also extends through the power distribution network between the secondary line transformer 36 and each neutral bus 34. The branch circuit breakers 26, 28 and 30 protect the branch conductors 18, 22 and 24, respectively, from current overload conditions by tripping open upon the occurrence of an increased current drawn through any one of the branch lines. Similarly, the main distribution breakers 40 protect the distribution conductors 42 from current overload conditions.

The transmitter 10 receives electrical power from one of the branch conductors, e.g. 18, and draws or absorbs current from that particular branch line in a predetermined pattern or waveform. The predetermined pattern or current waveform drawn from the particular branch conductor to which the transmitter is connected induces a predetermined electromagnetic field directly related to the current waveform. The electromagnetic field extends along all of the branch conductors and each of the electrical devices operatively connected with these conductors. For example, when the transmitter 10 is connected into the branch conductor 18, the electromagnetic field is present at the branch conductor 18, the branch circuit breaker 26, and at one of the distribution conductors 42 and main distribution circuit breakers 40 and feeder conductors 38 electrically connected to the branch line circuit breaker 26 and over the neutral conductor 32.

The receiver 12 includes an electromagnetic field transducer means positioned at the distal end of a probe 46. The receiver 12 operatively senses the strength of the predetermined electromagnetic field, rejects substantially all other signals and operatively indicates the strength of the electromagnetic field by lighting one of a plurality of indicators 48. In this manner, branch conductors, electrical devices connected to the branch conductors, branch circuit breakers, distribution conductors, main distribution breakers, the feeder conductors and the neutral conductors can be traced and identified without interrupting the supply of power from the power distribution network.

Identification proceeds by placing the transducer means of the probe 46 adjacent each of the electrical devices in question and noting the field strength indication on the indicators 48 with respect to each. The particular electrical device exhibiting the greatest field strength indication is the device identified. As will become more apparent, the nature and operation of each transmitter 10 and receiver 12 provide an improved capability for tracing and identifying electrical devices.

One embodiment 10' of the transmitter 10 is better understood by reference to FIGS. 2 and 3A to 3I. As shown in FIG. 2, the transmitter 10' comprises a power supply circuit 50, a duty cycle controller 52, a gated oscillator 54, a driver circuit 56, and an output circuit 58. The power supply circuit 50 generally draws applied AC or DC power from the power distribution network through the plug prongs 14. Alternating current power is rectified by a full wave rectifier 60 and pulsating direct current power (FIG. 3G) is applied on conductor 62 to a conventional integrating and regulating circuit comprising a transistor 64, a Zener diode 66, a capacitor 68, and the resistors 70 and 72. Regulated DC power is thereby present on terminal 74 and is conducted to other active components of the elements 52, 54, 56 and 58 of the transmitter 10'.

Figure 3A:
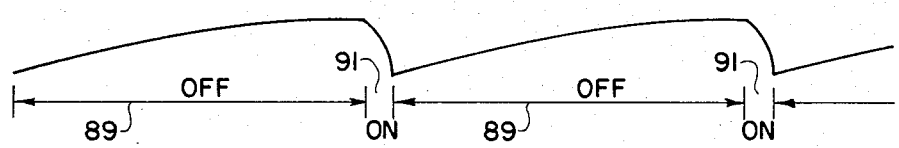
Figure 3B:
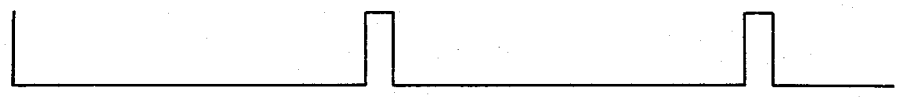

In the duty cycle controller 52, a pair of capacitors 76 and 78 are electrically connected in series between the terminal 74 and a ground reference 80. The input terminal to an inverting Schmitt trigger 82 is connected to the terminal 3A between capacitors 76 and 78. The output terminal 3B of the Schmitt trigger 82 is connected to the input terminal 3A through a parallel-branch feedback network comprising resistors 84 and 86 and a diode 88. The capacitors 76 and 78, the resistors 84 and 86, and the diode 88, in conjunction with the Schmitt trigger 82, form a resistive capacitive timing network of the duty cycle controller. Capacitors 76 and 78 charge and discharge at terminal 3A in accordance with the waveform diagram shown in FIG. 3A. The output waveform from the Schmitt trigger 82 at terminal 3B is illustrated in FIG. 3B. Accordingly, the two time periods established by the timing network, as shown in FIGS. 3A and 3B: a considerably longer off-time period 89, for example approximately 900 milliseconds, and a considerably shorter on-time period 91, for example approximately 45 milliseconds. The ratio of the on-time period 91 to the off-time period 89 is controlled by the ratio of the sum of the resistances of resistors 84 and 86 to the resistance of the resistor 84. The on-time period 91 and the off-time period 89 are controlled by the values of the resistors 84 and 86 in relation to the values of capacitors 76 and 78. The diode 88 operatively connects the resistor 86 in the feedback path of Schmitt trigger 82 during the on-time period 91 but eliminates the resistor 86 from the feedback path during the off-time period 89.

Figure 3C:
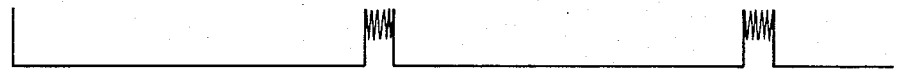
Figure 3D:
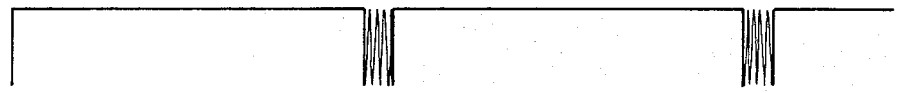

The gated oscillator 54 is operative during the on-time period 91 when a diode 90 connected between terminal 3B and an input terminal 3C of an inverting Schmitt trigger 92 is not conductive. A capacitor 94 is connected between terminal 3C and the ground reference 80. A resistive feedback path defined by resistor 96 and potentiometer 98 is connected between an output terminal 3D of the Schmitt trigger 92 and its input terminal 3C. When the potential of the signal at terminal 3B attains its minimum level during the off-time period 89, the diode 90 is conductive. The voltage increases on capacitor 94 until the trip point of the Schmitt trigger 92 is attained. At the trip point, the resistive feedback path of the resistor 96 and potentiometer 98 in conjunction with the capacitor 94 causes the Schmitt trigger 92 to oscillate at a frequency established by the values of the elements 94, 96 and 98, for example about 6 kHz. The frequency of oscillation can be adjusted by varying the resistance of the potentiometer 98. The oscillation occurring during the on-time period 91 is illustrated in FIGS. 3C and 3D, with FIG. 3C illustrating the input signal at terminal 3C and FIG. 3D illustrating the output signal at terminal 3D from the Schmitt trigger 92.

Four parallel-connected, inverting Schmitt triggers 100, 102, 104 and 106 primarily define the driver circuit 56. The Schmitt triggers 100, 102, 104 and 106 receive as an input signal the signal at terminal 3D shown in FIG. 3D. The Schmitt triggers of the driver circuit 56 provide added current to drive a transistor 108 of the output circuit 58. The waveform at the common output terminal 3E of the Schmitt triggers 100, 102, 104 and 106 is shown in FIG. 3E.

Figure 5A:
FIG. 5A is a time line diagram showing an expanded time reference for correlating a portion of FIG. 3E to FIGS. 3F, 3G, 3H and 3I.
Figure 3F:
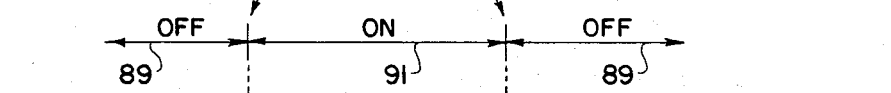
Figure 3G:

The output circuit 58 draws high freqency alternating current from the power distribution network when the transistor 108 is conductive. Of course, the transistor 108 conducts in accordance with the alternating high frequency current established during the on-time period 91 of the waveform, shown in FIG. 3E. When conductive, the transistor 108 operatively connects resistors 110 and 112 between the conductor 62 and the ground reference 80. Since the transistor 108 conducts in accordance with its input signal (FIG. 3E) during the on-time period 91, a high frequency current is conducted through resistors 110 and 112 as shown by the current waveform in FIG. 3H, which is better illustrated by virtue of the time expansion shown by FIG. 5A. FIG. 3G illustrates the voltage waveform present on conductor 62 and at terminal 3G. A gas indicator bulb 114 lights during the time periods that the transistor 108 is conductive and indicates the operation of the transmitter 10.

Figure 3H:
Figure 3I:

The high frequency rectified current loading shown in FIG. 3H is conducted from the full wave rectifier 60 over conductors 115 and 116 to the pronged plug 14, as the alternating waveform shown in FIG. 3I. A varistor 118, is connected between conductors 115 and 116 to protect the transmitter 10 from overvoltage conditions due to voltage transients, lightning and inductive spikes and the like and from possible improper use. A fuse 120 is connected in the conductor 116 to protect the transmitter from excessive currents.

One of the significant advantages of conducting a high frequency current loading signal from the power distribution network in the duty cycle established by the on and off time periods 91 and 89 respectively, is that the high-frequency current-conducting transistor 108 does not experience excessive heating. The extent of heating of the transistor is related to the square of the voltage at the plug prong 14 during the time when the transmitter is conductive. In a practical embodiment, the transistor 108 can conduct as much as one amp of current which, during the time the transistor is conductive, results in significant heat creation. However, by operating with a duty cycle having a significantly long off-time period 89 as compared to the on-time period 91, the average effect of the heating is greatly reduced. The relatively large current conducted during the on-time period creates an electromagnetic field of sufficient strength to be reliably detected at significantly remote locations along the conductors within the power distribution network. By not operating with a duty cycle characteristic, the strength of the field would be substantially reduced, or relatively expensive and additional components would be required to obtain comparable field strength. Accordingly, the number and cost of the elements in the transmitter is reduced, the life of the transistor 108 is prolonged and the reliability of the transmitter is enhanced.

Figure 4:
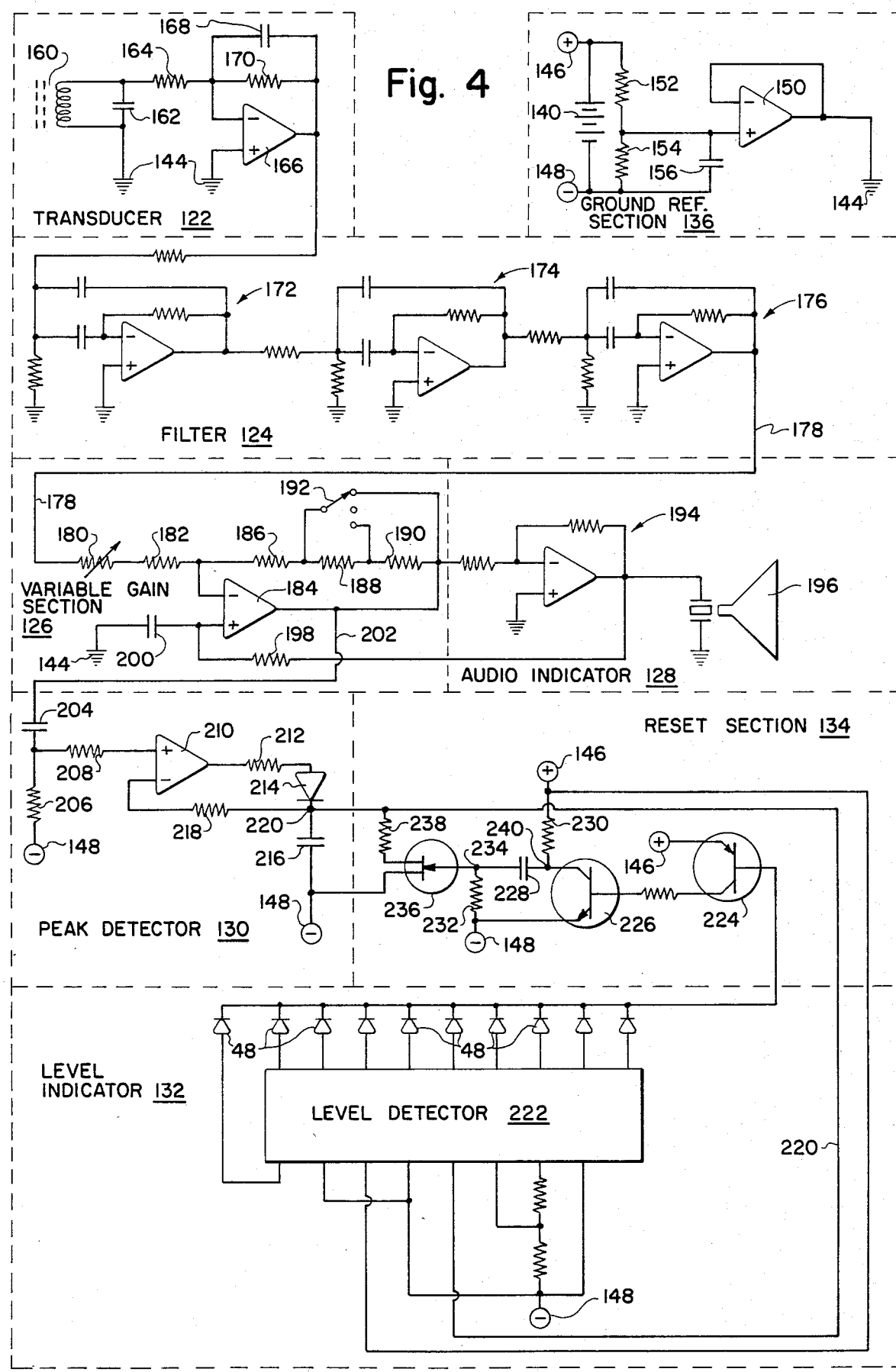
FIG. 4 is a schematic view of one embodiment of the receiver shown in FIG. 1.

One embodiment 12' of the receiver 12 is better understood by reference to FIG. 4. The receiver 12' includes a transducer means 122, a filter section 124, a variable gain section 126, an indicator section 128, a peak detector 130, a level indicator 132, and a reset section 134 operatively connected together. In addition, the receiver 12' includes a ground reference section 136 for maintaining the voltage reference levels of the elements of the receiver 12'.

The receiver 12' receives energy from self-contained batteries 140 and 142 of the ground reference section 136. The battery 140 is electrically connected between terminals 146 and 148 to operatively establish a positive voltage level on terminal 146 and a negative voltage level on terminal 148. The positive and negative voltage levels at terminals 146 and 148, respectively, are equally spaced above and below ground reference 144 and are maintained in the equally spaced relationship by the operational amplifier 150, the resistors 152 and 154 and the capacitor 156 connected in a known operative arrangement.

The transducer 122 is of the inductive type and utilizes an inductor or coil 160. A capacitor 162 is connected in parallel relationship with the inductor 160, and the capacitor-inductor combination is a tuned or resonant circuit with a resonant frequency equal to the frequency of the current loading pulses delivered by the transmitter 10 during the on-time period 91. A resistor 164 is connected between the coil 160 and capacitor 162 and the inverting input terminal of an operational amplifier 166. The resistor 164 reduces the effects of ringing in the tuned circuit 160 and 162 which may occur as a result of high-frequency transients that appear randomly and spuriously on the conductors of the power distribution network. A feedback loop defined by a capacitor 168 and resistor 170 is connected between the output terminal of the operational amplifier 166 and its input terminal. The values of elements 164, 168 and 170 establish the operational amplifier 166 as a low gain, low pass frequency amplifier. Accordingly, the signal inductively received by the tuned circuit 160 and 162 is amplified to a magnitude well within the range between the positive and the negative voltage supply levels established by the ground reference section 136. The values of the elements 164, 166, 168 and 170 also operatively establish a roll-off frequency point, for example about 35 kHz, at a frequency substantially higher than the high-frequency signal from the transmitter 10 but substantially less than the major high-frequency components of voltage transients and spikes. A very flat gain response is thereby obtained between the frequency of the transmitter signal and the power line frequency, typically 60 Hz. Consequently, the power line frequency will not be amplified more than the transmitter signal frequency, and the high frequency transients and spikes will be attenuated.

The filter section 124 basically comprises three serially connected filter means, 172, 174 and 176. Each of the filter means 172, 174 and 176 is an identical Sallen-Key band-pass filter of well-known circuit configuration. The component values of each Sallen-Key band-pass filter are selected to provide a low Q for each individual filter, for example approximately two. As is well known, a Q is one measure of the ability of a band-pass filter to pass a particular range of frequencies. One definition of Q is the center frequency of the band pass filter divided by the frequency band width which the filter passes. Band-pass filters with high Q's are more susceptible to ringing than band-pass filters of lower Q's. During ringing a band-pass filter is rendered inoperative for its intended purpose. By placing three relatively low Q filters in series, the total Q of the filter section 124 for band-pass purposes is the sum of the Qs of each filter. For example, if each of the filters 172, 174 and 176 has an individual Q of two, the total Q of the filter section 124 is approximately six with respect to filtering the desired signal. The ability of the filter section 124 to withstand the effects of ringing from high-frequency transients is not related to its total Q, as it would be in the case of a single high Q filter. Instead, the ability to withstand ringing in the filter section 124 is related to the ability of one of the filters 172, 174 or 176 to withstand the potential for ringing. As an important result, the filter section 124 is highly selective in passing only the transmitter signal but is not highly susceptible to ringing. Accordingly, the signal present on conductor 178 is essentially a signal directed related to the high-frequency current loading created by the transmitter 10. The alternating power frequency has been selectively removed by the operational effects of the Sallen-Key filter means 172, 174 and 176. In addition, the effects of high-frequencies have been significantly attenuated by the coil 160 and capacitor 162, and by the resistive capacitive network of elements 164, 168 and 170. The three Sallen-Key band-pass filter means 172, 174 and 176 even further isolate and supply the signal created by the transmitter 10.

The signal available on conductor 178 is generally referenced positively with respect to ground 144. The positive reference results because each of the operational amplifiers of the Sallen-Key band-pass filters 172, 174 and 176 are referenced directly to ground 144 without current offsets.

It is the general function of the variable gain section 126 to amplify the signal on conductor 178 and to reference that signal midway between the positive and negative voltage levels at terminals 146 and 148. The signal on conductor 178 is applied through a potentiometer 180 and a resistor 182 to the inverting input of an operational amplifier 184. A feedback network comprising resistors 186, 188 and 190 and a multiposition switch 192 is provided to adjust the gain of the operational amplifier 184. By positioning the switch 192 in one of its three positions, one or more of the resistors 186, 188 and 190 is connected in the feedback network to control the gain. The various stages of gain provided by the feedback network accommodate different strengths of signals detected. It is apparent that the high-frequency current drawn by the transmitter 10 induces a signal strength in the conductors which diminishes in accordance with the length over which the signal is conducted, the number of elements through which the signal must be conducted and the presence of an exterior shielding enclosure. The highest gain available is when the switch 192 is open and all resistors 186, 188 and 190 are connected in the feedback loop. The highest level of gain is desirable for identifying current carrying devices in panel boxes or distribution or feeder conductors. In the medium gain setting, where resistors 186 and 190 are connected in the feedback loop, the gain is generally sufficient for tracing and identifying circuit breakers and switches. The low stage of gain, when switch 192 connects only resistor 186 in the feedback loop, is useful for detecting accessible branch conductors, for example.

With the appropriate level of gain established, the signal supplied from the output terminal of the operational amplifier 184 is supplied to an inverting input terminal of an operational amplifier 194 of the indicator section 128. The current supplied from the operational amplifier 194 drives a piezoelectric speaker 196. The speaker 196 supplies an audio signal at the frequency of the current loading signal from the transmitter 10, for example 6 kHz. This frequency of the transmitter signal is easily audibly perceived by the user as an assurance of proper identification and use of the transmitter 10 and receiver 12.

Feedback from the output terminal of the operational amplifier 194 is conducted from the audio indicator section 128 through a resistor 198 to the noninverting input of the operational amplifier 184 of the variable gain section 126. A capacitor 200 charges to the center level of the signal delivered from the operation amplifier 194. Since the operational amplifiers 184 and 194 each invert their input signals, the signal present on capacitor 200 is essentially of the same polarity as the average center level of the signal supplied to the inverting input terminal of the operational amplifier 184. Accordingly, the signal supplied at the output terminal of the operational amplifier 184 is centered with respect to the ground reference 144 and this signal is applied on conductor 202 to the peak detector section 130.

In the peak detector 130, the signal on conductor 202 passes through capacitor 204 which, in conjunction with resistor 206, changes the level of the signal on conductor 202 from being referenced to the ground reference 144 to being referenced to the negative voltage level at terminal 148. A resistor 208 is connected between the noninverting input of an operational amplifier 210 and the capacitor 204. The resistor 208 prevents current from being drawn from the capacitor 204 when the voltage on the capacitor 204 swings below the negative voltage level at terminal 148 on every other half cycle of the signal on conductor 202. Output current delivered from the output terminal of the operational amplifier 210 is conducted through a resistor 212, a diode 214 to a capacitor 216. As will become more apparent, the capacitor 216 is normally maintained in a discharged condition with respect to the negative voltage level on terminal 148. During the off-time period 89 of the transmitter signal, no signal is present on conductor 202, and the voltage signal applied to the noninverting input of the operation amplifier 210 is essentially at the negative power supply voltage at terminal 148. The output terminal of the operational amplifier 210 is also held at the negative power supply voltage of terminal 148 due to the discharged condition of the capacitor 216. The feedback resistor 218 assures that the output terminal of the operational amplifier 210 is maintained at the negative supply voltage by balancing the offset voltages produced by the operational amplifier 210 and the resistor 208.

Upon the detection of a current loading signal from the transmitter 10, the operational amplifier 210 delivers pulses of current to the diode 214 and creates a voltage level on conductor 220 which is somewhat positive with respect to the negative supply voltage 148. The resulting signal on conductor 220 creates effects in the level indicator 132 and the reset section 134 which allow the capacitor 216 to charge to a level representative of the maximum level of the current loading frequency signal with respect to the negative supply voltage. Stated another way, the voltage on capacitor 216 will be allowed to increase to one half of the maximum peak to peak voltage of the signal present at the noninverting input terminal of the operational amplifier 210. The resistor 212 allows the voltage level on the capacitor 216 to increase at a predetermined rate and causes the voltage on capacitor 216 to reach its maximum value only after a predetermined number of complete cycles of the current loading transmitter signals have been conducted through the operational amplifier 210.

The voltage level on conductor 220 is supplied to a level detector means 222 of the level indicator section 132. The level detector 222 is a bar and dot graph integrated circuit marketed under the designation LM3914N. The level detector 222 has connected thereto a plurality of ten light-emitting diodes, each of which is referenced 48. The diodes 48 are arranged in a predetermined order along a predetermined scale. Depending upon the voltage level on the conductor 220, one of the diodes 48 will be energized. A higher voltage level on the conductor 220 will energize a light-emitting diode toward one end of the predetermined scale, and a lower voltage level will energize the light-emitting diode toward the other end of the predetermined scale. By noting the position of the light-emitting diode 48 which is energized, the relative strength of the transmitter signal is indicated. The user can determine which of the various electrical devices in close proximity to the probe 46 (FIG. 1) containing the transducer 122 is conducting the current loading signal created by the transmitter 10.

Figure 5B:
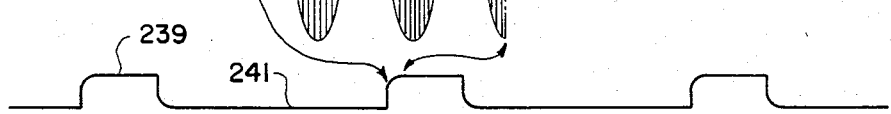
FIG. 5B is a waveform diagram utilizing the same time reference as employed in FIGS. 3A to 3I, illustrating the operation of the receiver shown in FIG. 4.

The reset section 134 operates in conjunction with the level detector 132 to periodically allow the capacitor 216 to charge to a predetermined maximum voltage, to hold the maximum voltage for a predetermined period of time, and to thereafter discharge to a condition ready for reception of another current loading signal supplied by the transmitter. The reset section 134 includes a transistor 224 which is rendered conductive when one of the light-emitting diodes 48 is energized by the level detector 222. When transistor 224 becomes conductive, it triggers transistor 226 into conduction. Normally, transistor 226 is not conductive and capacitor 228 has charged through resistors 230 and 232 to a voltage level present between the positive supply voltage 146 and the negative voltage 148. A terminal 234 of the capacitor 228 thereby achieves a voltage approximating the negative supply voltage at terminal 148. The terminal 234 is connected to the gate terminal of a field effect transistor 236. The source terminal of the transistor 236 is also connected to the negative supply voltage 148. When the gate terminal voltage and the source terminal voltage are approximately equal, the transistor 236 becomes conductive to discharge the capacitor 216 through resistor 238. The transistor 236 remains conductive only during the time period that a signal is not present on conductor 220, i.e. when transistors 224 and 226 are not conductive. However, when transistor 224 becomes conductive under the condition of a signal being applied to conductor 220 and one of the light-emitting diodes 48 becomes conductive, the terminal 240 of capacitor 228 is operatively connected to the negative supply voltage at terminal 148. The voltage at terminal 234 immediately goes to a level substantially below the negative supply voltage at terminal 148 which causes the transistor 236 to become nonconductive. The capacitor 216 commences charging and continues to charge so long as the voltage at terminal 234 remains below the voltage at the negative supply voltage at terminal 148. This condition exists for a sampling time period 239, shown in FIG. 5B, the length of which is determined by the discharge period established by the values of the resistor 232 and capacitor 228. The time period 239 is substantially greater than the on-time period 91 of the transmitter signal but less than the off-time period 89 of the transmitter signal (FIGS. 3E and 8J). Accordingly, the capacitor 216 is in condition to charge to its maximum level during the time period 89 that the transmitter 10 creates the current loading signal. For false spurious signals of short duration and of frequency comparable to the transmitter frequency, resistor 212 is conductive only momentarily and capacitor 216 does not attain a significant level to operatively result in a discernably intelligible indication at the light-emitting diodes 48 before the false signal dissipates.

The maximum voltage level to which capacitor 216 is charged is maintained during the sampling time period 239. The maximum charge level is maintained on conductor 220 for a sufficient period of time 239 to allow the level detector 222 to energize the appropriate light-emitting diode 48 and indicate the maximum attained transmitter signal strength. By holding the voltage level on conductor 220 for the sample time period 239, a constant indication is available from one of the diodes 48 for an amount of time sufficient for intelligent observation. After the sampling time period 239 ends, the transistor 236 again becomes conductive and the capacitor 216 is immediately discharged through resistor 238. In the discharged condition during a reset time period 241, the receiver awaits the reception of another current loading transmitter signal during the on-time period 89. Once the first cycle of the transmitter signal is conducted through the receiver 12' in the manner described, the capacitor 216 again starts charging to the maximum level during the sample period 239. After the appropriate light-emitting diode 48 has been energized to indicate the maximum attained transmitter signal strength, represented by the voltage level on conductor 220 and across capacitor 216, the capacitor 216 is again discharged during the reset time period 241. During the reset time period 241, the capacitor 228 recharges to the voltage level between the positive and negative supply terminals 146 and 148, respectively. The length of the reset time period 241 is established by the values of the capacitor 228 and the resistors 230 and 232.

From the foregoing description, it is apparent that the receiver 12' operates during the sample time period 239 to indicate the presence and strength of the transmitter signal. The detected signal is effectively filtered by an improved filtering arrangement to eliminate or reduce the influence of spurious signals such as voltage transients. Occasional spurious signals which may be coupled through the receiver to the diodes 48 remain only for a short period of time due to the lack of significant effects from false signals and/or the relatively short sample and reset periods of operation provided by the reset section 134. Any false or spurious signals are quickly eliminated from consideration because they do not continually cause the repeated energization of the same or approximately the same light-emitting diode, as would occur upon detection of a constantly applied transmitter signal of the same signal strength. Accordingly, not only does the receiver 12' utilize improved filtering techniques to eliminate many of the adverse effects of spurious signals, but its indication of the strength of the transmitter signal has the effect of substantially further eliminating various adverse effects. By causing the sample period 239 to be considerably longer than the on-time period 91 of the transmitter signal, a sufficient time frame is established whereby one group of current loading transmitter pulses will be detected and their signal strength established. By making the sample period 239 less than the off-time period 89 of the transmitter signal, only one signal group from the transmitter will have an operative effect on the receiver 12. By making each period of receiver operation (the sum of periods 239 and 241) less than the period of the transmitter duty cycle (the sum of periods 89 and 91), the receiver will be in condition to respond to each new signal supplied by the transmitter. Accordingly, the improved filtering and sampling effects of the receiver assure high transmitter signal sensitivity and improved immunity to the effects from spurious signals, to a degree which has heretofore been unavailable in the field of tracing and identifying electrical conducting devices.

Figure 6:
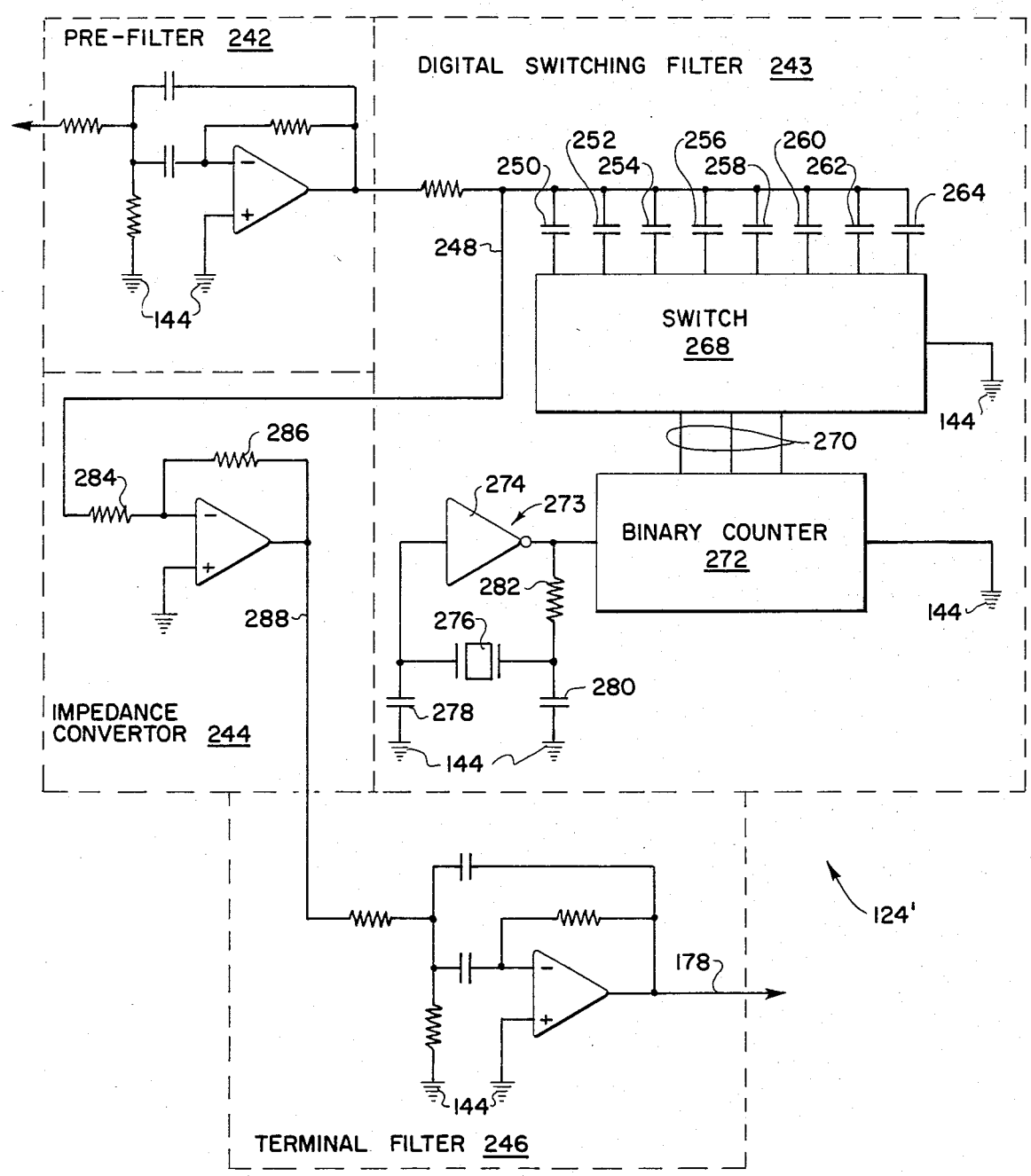
FIG. 6 is a schematic diagram of an alternative portion of the receiver shown in FIG. 4.

Another embodiment of an improved receiver can be understood by reference to FIG. 6. The elements illustrated in FIG. 6 are an alternative to the Sallen-Key band-pass filter means 172, 174 and 176 employed in the filter section 124 of the receiver 12' shown in FIG. 4. The function of the elements shown in FIG. 6 is to provide more improved filtering than that available from the technique of serially connecting a plurality of relatively low Q band-pass filters. An even more improved and enhanced sensitivity and ability to reliably detect the transmitter signal results.

The improved filter section 124' shown in FIG. 6 includes a prefilter means 242, a digital switching filter means 243, and impedance converter means 244 and a terminal filter means 246. The prefilter 242 takes the form of a typical Sallen-Key band-pass filter which employs resistive and capacitive component values selected to primarily reduce the typical alternating current power frequency, i.e. 60 Hz, and other low frequencies to an acceptable level for preventing unnecessary influences on the digital switching filter 243. The digital switching filter 243 has the capability of allowing only signals of a very narrow preselected main band-pass frequency to remain on conductor 248, as well as very low frequencies and harmonics of the main band-pass frequency. The other signals on conductor 248 are in essence coupled to ground 144 and are not passed to the impedance converter 244. Signals of a spurious or random nature are therefore essentially coupled to ground since such signals typically do not fall within the low frequency range or the precise narrow primary band-pass frequency range or harmonics of the primary band-pass frequency. In essence, the digital switching filter 243 will pass signals having a consistent repetitious phase angle relative to the phase angle of the signals of the primary band-pass frequency.

The digital switching filter 242 comprises a plurality of capacitors 250, 252, 254, 256, 258, 260, 262 and 264 which are connected between the conductor 248 and the eight output terminals of a one-of-eight input select switch 268. The switch 268 functions to connect one of its output terminals to which the capacitors 250-264 are connected, to the ground reference 144. The one of the output terminals which is connected to ground is selected by a binary signal supplied on conductors 270. While the selected input is connected to ground reference 144, the remaining other inputs are disconnected from ground reference and are allowed to float, thereby not providing a conduction path through those other inputs to the ground reference. A binary counter 272 supplies signals on the conductors 270. A clock signal is supplied to the clock terminal of the binary counter 272 from an oscillator 273, which comprises an inverting operational amplifier 274, a crystal 276, capacitors 278 and 280 and a resistor 282. The predetermined operational frequency of the oscillator 273 is established and is very precisely regulated by the characteristics of the crystal 276. The oscillator frequency supplied to the clock input terminal of the binary counter 272 is an exact predetermined multiple of the predetermined narrow band-pass frequency of the digital switching filter 243, with the predetermined multiple being equal to the number of output terminals of the switch 268 to which capacitors are connected. For example, if the primary band-pass frequency of the digital switching filter is 6 kHz, the frequency of the clock pulses supplied by the oscillator 273 to the clock terminal of the binary counter 272 is 48 kHz.

For signals at the primary band-pass frequency of the digital switching filter 243, each of the capacitors 250-264 will charge or integrate over one eighth of each cycle of the signal. Each capacitor will eventually charge to a level equal to an average applied signal level during its conduction interval. Thereafter, when a current conduction path exists through each of the capacitors 250-264 during its conduction interval, the voltage level previously established on that capacitor is essentially equal to the voltage level present on conductor 248 during that time interval. The voltage level or signal on conductor 248 is thereby unaffected since the switching of the capacitor 250-264 to ground reference 144 does not adversely shunt the signal level on conductor 248 to ground. However, for signals which are not in phase with the primary band-pass frequency or its harmonic multiples, each of the capacitors 250-264 will charge to randomly different levels during the intervals when they are connected individually to the ground reference 144. Accordingly, since there will be no similarity of the signal levels on the capacitors 250-264 relative to the applied signal on conductor 266 during the subsequent conduction intervals, a substantial portion of the signal on conductor 248 will be shunted to ground 144 or will be smoothed by the effect of the capacitors 250-264 discharging to or from the conductor 248. The end result is that all signals other than the primary band-pass frequency or its exact multiples are substantially attenuated on conductor 248.

The impedance converter 244 essentially buffers the impedance of the digital switching filter 243 with respect to the terminal filter 246. The impedance converter 244 also provides a desired amount of gain established by its feedback resistor 286. The signals which are allowed to pass from the digital switching filter 243 on the conductor 248 are passed through the impedance converter 244 on conductor 288 to the terminal filter 246.

The terminal filter 246 essentially comprises another typical Sallen-Key band-pass filter, the primary function of which is to attenuate any switching noise included with the signal on conductor 288. The terminal filter 246 also attenuates any harmonic frequency components that may be included with the signal. The terminal filter supplies its signal on conductor 178, to the other elements of the receiver 12' shown in FIG. 4. The receiver 12' otherwise functions in the manner previously described.

Due to the precise frequency passage characteristics of the digital switching filter 243, a highly reliable means for filtering or attenuating all spurious signals except the predetermined transmitter signal is achieved. Operation of the receiver 12 is thereby rendered even more immune to spurious signals, transients and potential ringing. The receiver 12 becomes even more reliable in identifying and tracing electrical devices which conduct the predetermined transmitter signal.

A transmitter 10" shown in FIG. 7 includes circuit elements functioning to deliver constant energy content current loading pulses to the power distribution network. The desirable result available from transmitting constant energy content current loading signal pulses is that the detected electromagnetic signals have approximately the same signal effect on the receiver 12 irrespective of the magnitude of the instantaneous voltage on the power distribution network. The end result is that the receiver 12 will exhibit approximately the same sensitivity for signals from the transmitter 10", regardless of the point in time in the alternating power supply cycle that the signal pulses are delivered, and even in power distribution networks with different voltages.

The energy content of a pulse is determined by its magnitude or voltage and its time width or duration. Specifically, the energy content is equal to the integral of the magnitude of the pulse over its time duration. FIG. 8L indicates the hyperbolic relationship of magnitude and duration to obtain a pulse of predetermined constant energy content. It is apparent that if the magnitude varies, for example, the duration must be adjusted accordingly to obtain the constant energy pulse. In the specific application described herein, the voltage magnitude of the transmitter pulse will vary continuously due to the alternating nature of the applied voltage over the power distribution network, and because the transmitter and receiver may be utilized in conjunction with power distribution networks in which different voltage levels are present. It is one of the functions of the transmitter 10" to modulate the time duration of the pulses in accordance with the constant energy hyperbolic relationship by utilizing the instantaneous voltage at approximately the time when the pulse is initiated as an independent variable.

Constant energy current loading pulses create beneficial effects at the resonant or tuned circuit defined by the inductor 160 and capacitor 162 of the transducer 122 of the receiver 12 (FIG. 4). It has been discovered that a tuned circuit will integrate signals applied to it, and the output signal of the tuned circuit is the product of integrating the signal level with time, so long as the duration of the applied pulse signal does not exceed the time period of a half wave at the resonant frequency. Upon applying constant energy pulses, the output signal from the tuned circuit is of constant magnitude at the resonant frequency. The constant output signal obtains a more reliable, accurate and sensitive indication from the receiver.

The output signal from a tuned circuit will essentially be a sine wave even though the input signal is a pulse wave. Assuming a positive going input pulse, the sine wave supplied from the resonant circuit will be in a phase relationship with the input pulse such that the center point (ninety degree phase position) of the positive going half wave of the sine wave output will be centered about the center point of the input pulse. Since the transmitter 10" will be delivering constant energy pulses of different magnitude and pulse width durations, it is important to consistently deliver the current loading pulses from the transmitter 10" at consistent time intervals equal to the period of the transmitter frequency to consistently reinforce the sine wave established in the resonant circuit in a consistent phase relationship. Since the current loading pulses will be pulse width modulated, the initial leading edges of these pulses from the transmitter 10" will vary slightly with respect to the time center point of each pulse delivered, and of course, the time center point of each delivered pulse will be desireably positioned at the equal intervals of the transmitter frequency.

The hyperbolic relationship set forth in FIG. 8L also describes in proportional terms the time at which the leading edge of a pulse is to be initiated relative to a center reference at the center of the time duration of pulses of various widths. This proportionality relationship exists because the first half of the pulse will also possess constant energy characteristics, and the width of the first half of the pulse is established by the leading edge of the pulse relative to the pulse center point.

The transmitter 10", shown in FIG. 7, includes circuit elements for achieving the above discussed considerations. The transmitter 10" comprises a clock 290, a hyperbolic generator 292, a start pulse generator 294, a duty cycle controller 296, an output section 298 and a termination pulse generator 300. The clock 290 generally delivers frequency and timing signals for achieving proper operation of the transmitter 10". The hyperbolic generator 292 supplies a curve approximating a hyperbolic function, and the hyperbolic curve is utilized in establishing the point at which the leading edge of the current loading pulse will be delivered from the transmitter 10" so as to result in the centering of each current loading pulse at time intervals equal to the period of the transmitter frequency. The start pulse generator 292 delivers a signal on conductor 300 for initiating the leading edge of the current loading pulse. The duty cycle controller 296 achieves two important functions. One function is to limit the duration of each current loading pulse to a time not exceeding one half of the period of the transmitter frequency. A safety signal delivered over conductor 302 achieves this function. The second function is to establish the overall duty cycle of the transmitter 10". A signal delivered over conductor 304 establishes the duty cycle from the transmitter 10". Upon occurrence of the signals on conductors 300, 304 and 306, the output section 298 begins delivering current loading signal pulses to the power distribution network by absorbing power through the plug prong 14. The current loading pulses are of constant energy content, limited in pulse width duration to no greater than one half the period of the transmitter frequency, and are limited to the predetermined duty cycle established by the on-time 91 and off-time 89 (FIGS. 3A and 8J). After the initiation of each individual pulse, the termination pulse generator 300 integrates the magnitude of the voltage of the particular pulse width time, and delivers a termination pulse on conductor 306 when the constant energy content is attained. The termination pulse on conductor 306 operatively terminates the pulse from the output section 298. Thereafter, the transmitter 10" delivers the next constant energy pulse which is time centered with respect to the next time interval equal to the period of the transmitter frequency.

The clock 290 comprises a pair of inverters 308 and 310, a crystal 312 and capacitors and resistors connected in a manner to obtain a square wave clock signal (FIG. 8A) of predetermined frequency. The clock signal is supplied from the clock 290 on the conductors leading from terminal 8A. The frequency of the clock signal is a predetermined even multiple of the transmitter frequency. In the exemplary arrangement shown in FIG. 7, the clock frequency is eight times the desired transmitter frequency.

The hyperbolic generator 292 includes a binary counter 314 which receives the clock signal. The first three divide-by-two output terminals 8B, 8C and 8D of the counter 314 divide the clock signal and supply the pulse waveforms shown in FIGS. 8B, 8C and 8D, respectively. The signal on terminal 8D (FIG. 8D) establishes the transmitter frequency. The clock signal on terminal 8A and the signals on terminals 8B, 8C and 8D are applied through resistors to an integrating capacitor 316. When the signals on terminals 8A, 8B, 8C and 8D are high, the current is delivered to the capacitor 316 and the voltage thereacross is integrated. The resulting voltage across capacitor 316, present at terminal 8E, approximates a hyperbolic curve and is illustrated in FIG. 8E. The hyperbolic curve shown in FIG. 8E is established once during each initial half wave of the transmitter frequency square wave present at terminal 8D.

The start pulse generator 294 includes an operational amplifier 318 which receives a signal representative of the hyperbolic curve shown in FIG. 8E on its noninverting input terminal 8E. On the inverting input terminal, the comparitor 318 receives a signal on conductor 320 representative of the instantaneous voltage on the power distribution network. The signal on conductor 320 is obtained from the full wave rectifying bridge 60 which is connected through the plug prong 14 to the power distribution network. The resistors 322 and 324 reduce the magnitude of the applied power signal on conductor 320 to a level generally commensurate with and proportional to the magnitude of the hyperbolic curve signal. When the voltage of the hyperbolic curve signal on terminal 8E slightly exceeds the voltage on conductor 320, the output of the operational amplifier 318 goes high and the start signal is applied on conductor 300. Because the power distribution voltage is compared to the hyperbolic curve signal, the time relationship of the leading edge of the current loading pulse relative to the magnitude of the applied voltage is established, as previously described in conjunction with FIG. 8L. The current loading pulse is initiated at a time whereby the resulting center point of the pulse will occur coincidentally with the same reference or phase point in each cycle of the transmitter signal, and that pulse center point will occur approximately at the positive-going edge of the pulses shown in FIG. 8D. In this manner the transmitter pulses, even though variable in duration, are centered in time with respect to a consistent reference point or phase angle of each cycle of the transmitter signal. The result is that the timed circuit of the receiver transducer detects the constant energy pulse electromagnetic fields at consistent points in time to best reinforce and continue the resonance established by the prior pulses supplied by the transmitter.

The duty cycle controller 296 includes binary counters 326 and 328. The binary counter 326 is positive edge triggered while the counters 314 and 328 are negative edge triggered. The signal on terminal 8C is applied to the enable input of the counter 326. The signal on terminal 8C is a square wave having a frequency twice that of the transmitter frequency, as can be seen by comparing FIGS. 8C and 8D. Because the counter 326 is positive edge triggered, an output signal from the first divide-by-two output terminal connected to conductor 302 is a signal shown in FIG. 8F, and that signal is approximately ninety degrees delayed in phase from the transmitter frequency signal shown in FIG. 8D. The signal on conductor 302 is a safety signal and is operatively utilized for limiting the maximum pulse duration of the current loading pulses delivered by the transmitter 10' to no greater than one half of the period of the transmitter frequency period. The signal on conductor 302 is applied as one input to the AND gate 330.

The function of the binary counter 328 of the duty cycle controller 296 is to establish the overall transmission duty cycle for the transmitter 10''. Input signals to the counter 328 are taken from the twelfth divide-by-two output terminal 8G of the binary counter 314 and are shown in FIG. 8G. The on-time period of the square wave shown in FIG. 8G establishes the on-time period 91 of the transmitter duty cycle shown in FIG. 8J. Output signals from the counter 328 are supplied on the first divide-by-two output terminal 8H and the eighth divide-by-two output terminal 8I. The signal on terminal 8I, shown in FIG. 8I, is operative to establish the overall time period for each duty cycle from the transmitter 10''.

The signals on terminals 8F, 8G, 8H and 8I are supplied as inputs to the AND gate 330. A high signal from the output terminal 8J of the AND gate 330 is present on conductor 304 upon the coincidence of four high input signals to the AND gate 330, and this signal is shown in FIG. 8J. During the on-time period 91, the transmitter is allowed to deliver constant energy content current loading pulses to the power distribution network, as shown in FIGS. 8K and 8K'. During the off-time period 89 of the signal shown in FIG. 8J, the transmitter does not deliver signals. This arrangement, as described previously, greatly increases the power conducting capability, without detrimental heating.

An AND gate 332 receives the signals present on conductors 300, 304 and 306. As will be understood subsequently, the signal on conductor 306 is a normally high signal. The signal on conductor 300 is the start signal for initiation of the current loading pulse. The signal on conductor 304 is a signal which limits the time duration of current loading pulses. Upon receipt of three high signals on the conductors 300, 304 and 306, the AND gate 332 delivers a high trigger signal to the amplifier 334. The high signal, applied on the terminal 8K, biases a V-mos power transistor 336 to conduct current through a power resistor 338 to the ground reference. The current conducted through the power resistor 336 is reflected through the full wave bridge 60 to the power distribution network, in the manner previously described.

In order to terminate the current loading pulse after a sufficient time duration has lapsed in accordance with the magnitude of the pulse to obtain a constant energy content, the termination pulse generator 330 becomes operative to reduce the signal level on conductor 306 from a previous high level to a low level, thereby operatively terminating the bias signal to the transistor 336. When transistor 336 is conducting, resistor 340 applies approximately one half of the power network voltage to resistor 342. Capacitor 344 is charged through resistor 342. The resistor 342 and capacitor 344 act as an integrator and the voltage at terminal 346 is proportional to the energy content of each current loading pulse on an instantaneous basis. The voltage at terminal 346 is applied to the noninverting input terminal of an operational amplifier comparitor 348. The voltage level of a reference 350 is applied to the inverting input terminal of the operational amplifier 348. The voltage established by the reference 350 is of a magnitude equal to the voltage across capacitor 344 at terminal 346 when the predetermined constant energy content of each current loading pulse is attained. When the voltage at terminal 346 reaches a level below that of the reference 350, the signal on conductor 306 goes low, thereby terminating the pulse when the predetermined constant energy content has been achieved. The signal on conductor 302 biases the transistor 352 to prevent integration by the capacitor 344 except during times when the safety signal (FIG. 8F) is high. The maximum pulse width duration of the pulse is limited to a half-wave of the transmitter frequency, or fifty percent, thereby keeping within the limitation over which the resonant circuit will be effective for integration.

The transmitter 10'' thereby delivers constant energy content pulses over the power distribution network irrespective of the voltage applied to the power distribution network. The pulses occur over time periods which are centered at regularly occurring reference intervals equal to the period of the transmitter frequency. The duration of each pulse is limited to a predetermined portion of each cycle of the transmitter frequency, and the transmission of signals from the transmitter is limited to a predetermined duty cycle. The effect at the receiver 12 is that an approximately constant level signal is available from the transducer and variations in the voltage of the power distribution network will not create false signals which might otherwise falsely indicate an incorrect electrical device sought to be identified. Although the tramitter 10'' has been described primarily in conjunction with a use for tracing and identifying electrical conductors in a power distribution network, the previously described advantageous concepts of the transmitter 10'' may be utilized in other applications as well.

The significant advantages and improvements available from the embodiments of the transmitter and receiver of the present invention have been described. The specificity of description has, however, been made by way of example. The invention itself is defined by the scope of the appended claims.

What is claimed is:

1. Apparatus for tracing and identifying an electrical current carrying conductor or similar means when a current is conducted therein, comprising in combination:

transmitter means for connection to said conductor and for conducting electrical current through said conductor in repetitious transmission cycles, each transmission cycle being a predetermined waveform having a first predetermined time period during which a plurality of pulses of current are conducted at a predetermined frequency and a second predetermined time period during which no current is conducted, the first predetermined time period being less than the second predetermined period, and the current pulses conducted during the first predetermined time period being of sufficient magnitude to induce about said conductor a predetermined electromagnetic field having a frequency charcteristic corresponding to the predetermined frequency of current pulses conducted during the first predetermined time period; and receiver means responsive to the electromagnetic field about said conductor when placed in proximity of said conductor, said receiver means including
(a) transducer means responsive to the predetermined electromagnetic field for supplying signals corresponding to the frequency and strength of the predetermined electromagnetic field at the approximate location of said receiver means with respect to said conductor, (b) filter means responsive to signals from the transducer means and operative for passing detected signals having a predetermined frequency related to the predetermined frequency of the current pulses conducted by said transmitter means during the first predetermined time period and also operative for substantially blocking signals from said transducer means at other frequencies, (c) magnitude detector means responsive to the detected signals from the filter means and operative for deriving a magnitude signal representative of the strength or magnitude of the detected signal, (d) reset means operatively controlling said magnitude detector means during each of a plurality of consecutive repetitious predetermined detection cycles, each detection cycle having a sample time period and a reset time period, said reset means operatively enabling said magnitude detector means to function as recited during the sample time period and operatively disabling said magnitdue detector means to prevent the derivation of a magnitude signal over the reset time period, and (e) indicator means for indicating the relative magnitude of the magnitude signal during each sample time period and for terminating the indication during each reset time period; and wherein said transmitter means further comprises:

duty cycle control means for operatively establishing the first and second predetermined time periods and for supplying an energizing signal during the first predetermined time period;

gated oscillator means electrically connected to said duty cycle control means and receptive of the energizing signal for supplying a trigger signal oscillating at the predetermined frequency during the first predetermined time period;

load means for conducting current; and switch means receptive of the oscillating trigger signal and electrically connected to said load means and to said conductor for operatively conducting current pulses from said conductor to said load means at the predetermined frequency of the oscillating trigger signal.

2. Apparatus as recited in claim 1 wherein:
the sample time period is defined by a third predetermined time period and the reset time period is defined by a fourth predetermined time period, and the third predetermined time period is greater than the first predetermined time period and less than the second predetermined time period.

3. Apparatus as recited in claim 1 wherein the first predetermined time period is less than one-half the sum of the first and second predetermined time periods.

4. Apparatus as recited in claim 1 wherein the sample time period is defined by a third predetermined time period and the reset time period is defined by a fourth predetermined time period, and the sum of the third and fourth predetermined time periods is less than the sum of the first and second predetermined time periods.

5. Apparatus as recited in claim 1 wherein said means for indicating the magnitude of the received signals further comprises:
a plurality of indicators; and
level detector means having a plurality of output terminals and one input terminal, said level detector means further including means operatively connecting each of the output terminals to energize a corresponding one of said indicators, means operatively connected to the input terminal to apply the maximum instantaneous magnitude of the magnitude signal from said magnitude detector means to the input terminal, said level detector means operatively energizing the indicators in a predetermined order in accordance with the magnitude of the maximum instantaneous magnitude of the magnitude signal.

6. Apparatus as defined in claim 1 wherein the first time period is less than one half the total time period of the transmission duty cycle, and the sample time period is greater than the first predetermined time period.

7. Apparatus as defined in claim 6 wherein the sample time period is less than the second predetermined time period.

8. Apparatus as recited in claim 1 wherein said filter means comprises a plurality of separate relatively low Q band-pass frequency filters electrically connected in series.

9. Apparatus as recited in claim 1 wherein said filter means comprises a digital switching filter means.

10. Apparatus for tracing and identifying an electrical current carrying conductor or similar means, comprising in combination:

transmitter means for connection to said conductor and for conducting electrical current through said conductor in repetitious transmission cycles, each transmission cycle being a predetermined waveform having a first predetermined time period during which a plurality of pulses of current are conducted at a predetermined frequency and a second predetermined time period during which no current is conducted, the first predetermined time period being less than the second predetermined period, and the current pulses conducted during the first predetermined time period being of sufficient magnitude to induce about said conductor a predetermined electromagnetic field having a frequency characteristic corresponding to the predetermined frequency of current pulses conducted during the first predetermined time period; and receiver means responsive to the electromagnetic field about said conductor when placed in proximity of said conductor, said receiver means including (a) transducer means responsive to the predetermined electromagnetic field for supplying signals corresponding to the frequency and strength of the predetermined electromagnetic field at the approximate location of said receiver means with respect to said conductor, (b) filter means responsive to signals from the transducer means and operative for passing detected signals having a predetermined frequency related to the predetermined frequency of the current pulses conducted by said transmitter means during the first predetermined time period and also operative for substantially blocking signals from said transducer means at other frequencies, (c) magnitude detector means responsive to the detected signals from the filter means and operative for deriving a magnitude signal representative of the strength or magnitude of the detected signal, (d) reset means operatively controlling said magnitude detector means during each of a plurality of consecutive repetitious predetermined detection cycles, each detection cycle having a sample time period and a reset time period, said reset means operatively enabling said magnitude detector means to function as recited during the sample time period and operatively disabling said magnitude detector means to prevent the derivation of a magnitude signal over the reset time period, and (e) indicator means for indicating the relative magnitude of the magnitude signal during each sample time period and for terminating the indication during each reset time period; and wherein:

said magnitude detector means further comprises a first capacitor and means for charging said first capacitor to a value related to the instantaneous magnitude of the magnitude signal;

said reset means includes a first controllable switch means having two terminals electrically connected with said capacitor and also having a third terminal, said first switch means having electrical characteristics which control the extent of current conduction through the first and second terminals in accordance with a signal applied to its third terminal;

said reset means further includes a controllable timing circuit including a second capacitor, resistor means through which said second capacitor is charged and discharged in predetermined charge and discharge time periods which are respectively related to the reset and sample periods, said controllable timing circuit further including a second controllable switch electrically connected with said second capacitor in an operative relationship for charging and discharging said second capacitor; and said reset means further includes means electrically connected with said second capacitor to apply a signal to the third terminal of said first switch for rendering the first switch nonconductive during the sample period and for rendering the first switch conductive during the reset period.

11. Apparatus as recited in claim 10 wherein said second controllable switch is electrically connected with at least one of the output terminals of said level detector means and is rendered electrically conductive for discharging said second capacitor upon energization of at least one indicator.

12. Apparatus for tracing and identifying an electrical current carrying conductor or similar means, comprising in combination:

transmitter means for connection to said conductor and for conducting electrical current through said conductor in repetitious transmission cycles, each transmission cycle being a predetermined waveform having a first predetermined time period during which a plurality of pulses of current are conducted at a predetermined frequency and a second predetermined time period during which no current is conducted, the first predetermined time period being less than the second predetermined period, and the current pulses conducted during the first predetermined time period being of sufficient magnitude to induce about said conductor a predetermined electromagnetic field having a frequency characteristic corresponding to the predetermined frequency of current pulses conducted during the first predetermined time period; and receiver means responsive to the electromagnetic field about said conductor when placed in proximity of said conductor, said receiver means including (a) transducer means responsive to the predetermined electromagnetic field for supplying signals corresponding to the frequency and strength of the predetermined electromagnetic field at the approximate location of said receiver means with respect to said conductor, (b) filter means responsive to signals from the transducer means and operative for passing detected signals having a predetermined frequency related to the predetermined frequency of the current pulses conducted by said transmitter means during the first predetermined time period and also operative for substantially blocking signals from said transducer means at other frequencies, (c) magnitude detector means responsive to the detected signals from the filter means and operative for deriving a magnitude signal representative of the strength or magnitude of the detected signal, (d) reset means operatively controlling said magnitude detector means during each of a plurality of consecutive repetitious predetermined detection cycles, each detection cycle having a sample time period and a reset time period, said reset means operatively enabling said magnitude detector means to function as recited during the sample time period and operatively disabling said magnitude detector means to prevent the derivation of a magnitude signal over the reset time period, and (e) indicator means for indicating the relative magnitude of the magnitude signal during each sample time period and for terminating the indication during each reset time period; and wherein said filter means comprises a digital switching filter means and said digital switching filter means comprises:

a plurality of phase capacitors;

selectable switch means having a plurality of output terminals and at least one switch select input terminal and at least one reference terminal, said selectable switch means operatively connecting a selected one of the output terminals to the reference terminal, the selected one of the output terminals being designated in accordance with signals at each switch select terminal;

oscillator means for supplying a periodic signal at a predetermined oscillator frequency, the predetermined oscillator frequency being essentially an even multiple of the predetermined frequency of current pulses delivered by the transmitter means during the first predetermined time period; and counter means receptive of the signal from said oscillator means and for supplying to each switch select terminal signals representative of the count of the oscillator signal.

13. Apparatus for tracing and identifying an electrical current carrying conductor or similar means which has a varying voltage present thereon, comprising in combination:

transmitter means for connection to said conductor and for conducting electrical current through said conductor in repetitious transmission cycles, each transmission cycle being a predetermined waveform having a first predetermined time period during which a plurality of pulses of current are conducted at a predetermined frequency and a second predetermined time period during which no current is conducted, the first predetermined time period being less than the second predetermined period, and the current pulses conducted during the first predetermined time period being of sufficient magnitude to induce about said conductor a predetermined electromagnetic field having a frequency characteristic corresponding to the predetermined frequency of current pulses conducted during the first predetermined time period; and receiver means responsive to the electromagnetic field about said conductor when placed in proximity of said conductor, said receiver means including (a) transducer means responsive to the predetermined electromagnetic field for supplying signals corresponding to the frequency and strength of the predetermined electromagnetic field at the approximate location of said receiver means with respect to said conductor, (b) filter means responsive to signals from the transducer means and operative for passing detected signals having a predetermined frequency related to the predetermined frequency of the current pulses conducted by said transmitter means during the first predetermined time period and also operative for substantially blocking signals from said transducer means at other frequencies, (c) magnitude detector means responsive to the detected signals from the filter means and operative for deriving a magnitude signal representative of the strength or magnitude of the detected signal, (d) reset means operatively controlling said magnitude detector means during each of a plurality of consecutive repetitious predetermined detection cycles, each detection cycle having a sample time period and a reset time period, said reset means operatively enabling said magnitude detector means to function as recited during the sample time period and operatively disabling said magnitude detector means to prevent the derivation of a magnitude signal over the reset time period, and (e) indicator means for indicating the relative magnitude of the magnitude signal during each sample time period and for terminating the indication during each reset time period; and wherein said transmitter means further comprises:

means associated with said transmitter means and operative for generating a signal representative of an instantaneous voltage present on the conductor; and means operatively connected to said means for generating a signal representative of the instantaneous voltage and operative for varying the time duration of each current pulse in predetermined relation to the signal representative of instantaneous voltage present on the conductor during the duration of the pulse to establish an approximately predetermined constant energy content of each subsequent pulse during the first predetermined time period.

14. Apparatus as recited in claim 13 wherein said pulse time duration varying means comprises:

start generator means operatively connected to said means for determining the instantaneous voltage and operative for initiating each of the pulses conducted by said transmitter means during the first predetermined time period at a start time relative to a consistent reference interval for the pulses at the predetermined frequency, said start generator means operatively establishing the start time relative to the reference interval in accordance with a predetermined hyperbolic relationship of the magnitude of the voltage present on the conductor and the pulse duration time, and termination generator means for integrating the signal representative of the voltage magnitude on the conductor over pulse duration time and for operatively terminating the pulse upon the pulse attaining the predetermined constant energy content.

15. Apparatus as recited in claim 14 wherein said start generator means further comprises:

means for generating a signal representative of the predetermined hyperbolic relationship during each time period during which each pulse is delivered at the predetermined frequency, and means for comparing the signal representative of the hyperbolic relationship with the signal representative of the instantaneous voltage on said conductor.

16. Apparatus for tracing and identifying an electrical current carrying conductor or similar means, comprising in combination:

transmitter means for connection to said conductor and for conducting electrical current through said conductor in repetitious transmission cycles, each transmission cycle being a predetermined waveform having a first predetermined time period during which a plurality of pulses of current are conducted at a predetermined frequency and a second predetermined time period during which no current is conducted, the first predetermined time period being less than the second predetermined period, and the current pulses conducted during the first predetermined time period being of sufficient magnitude to induce about said conductor a predetermined electromagnetic field having a frequency characteristic corresponding to the predetermined frequency of current pulses conducted during the first predetermined time period; and receiver means responsive to the electromagnetic field about said conductor when placed in proximity of said conductor, said receiver means including (a) transducer means responsive to the predetermined electromagnetic field for supplying signals corresponding to the frequency and strength of the predetermined electromagnetic field at the approximate location of said receiver means with respect to said conductor, (b) filter means responsive to signals from the transducer means and operative for passing detected signals having a predetermined frequency related to the predetermined frequency of the current pulses conducted by said transmitter means during the first predetermined time period and also operative for substantially blocking signals from said transducer means at other frequencies, (c) magnitude detector means responsive to the detected signals from the filter means and operative for deriving a magnitude signal representative of the strength or magnitude of the detected signal, (d) reset means operatively controlling said magnitude detector means during each of a plurality of consecutive repetitious predetermined detection cycles, each detection cycle having a sample time period and a reset time period, said reset means operatively enabling said magnitude detector means to function as recited during the sample time period and operatively disabling said magnitude detector means to prevent the derivation of a magnitude signal over the reset time period, and (e) indicator means for indicating the relative magnitude of the magnitude signal during each sample time period and for terminating the indication during each reset time period; and wherein said transmitter further comprises:

duty cycle control means comprising a binary coded decimal counter having a plurality of output terminals, and gate means electrically connected for receiving input signals from said output terminals of said binary coded decimal counter, said gate means supplying a signal having characteristics which define the first and second predetermined time periods in accordance with a predetermined relationship of each input signal applied to said gate means;

means for delivering clock pulses to said binary coded decimal counter; and current switching means electrically connected to said conductor and controlled by the signal from said gate means for conducting current from said conductor during said first predetermined time period.

* * * * *